(12) United States Patent
Chen et al.

(10) Patent No.: US 11,271,362 B2
(45) Date of Patent: Mar. 8, 2022

(54) LASER DEVICE AND LIGHT GUIDE MEMBER USED WITH THE SAME

(71) Applicant: XIAMEN SANAN OPTOELECTRONICS TECHNOLOGY CO., LTD., Xiamen (CN)

(72) Inventors: Hui Chen, Xiamen (CN); Junpeng Shi, Xiamen (CN); Xinglong Li, Xiamen (CN); Chi-Wei Liao, Xiamen (CN); Weng-Tack Wong, Xiamen (CN); Chih-Wei Chao, Xiamen (CN); Chen-ke Hsu, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 43 days.

(21) Appl. No.: 16/831,512

(22) Filed: Mar. 26, 2020

(65) Prior Publication Data

US 2020/0227890 A1  Jul. 16, 2020

Related U.S. Application Data

(63) Continuation-in-part of application No. PCT/CN2017/104688, filed on Sep. 30, 2017.

(51) Int. Cl.
*H01S 5/00* (2006.01)
*H01S 5/024* (2006.01)
(Continued)

(52) U.S. Cl.
CPC ........ *H01S 5/0087* (2021.01); *H01S 5/02255* (2021.01); *H01S 5/02461* (2013.01);
(Continued)

(58) Field of Classification Search
CPC .. H01S 5/0087; H01S 5/02461; H01S 5/0609; H01S 5/4012; H01S 5/005;
(Continued)

(56) References Cited

U.S. PATENT DOCUMENTS

2013/0329397 A1* 12/2013 Shimizu .................... F21V 9/38
362/84
2013/0329416 A1* 12/2013 Shimizu .................. F21V 13/04
362/230

(Continued)

FOREIGN PATENT DOCUMENTS

| CN | 103486458 A | 1/2014 |
| CN | 103486542 A | 1/2014 |
| CN | 104075153 A | 10/2014 |

OTHER PUBLICATIONS

Search Report issued to PCT application No. PCT/CN2017/104688 by the CNIPA dated Jul. 5, 2018.

*Primary Examiner* — Kinam Park
(74) *Attorney, Agent, or Firm* — Thomas | Horstemeyer, LLP.

(57) ABSTRACT

The laser device includes a substrate, a laser element disposed on the substrate for emitting a laser light ray, a light guide member disposed on the substrate, and a wavelength conversion layer. The light guide member is light-transmissible and thermally conductive, and has at least one reflection surface for reflecting the laser light ray from the laser element so as to change travelling direction of the laser light ray. The wavelength conversion layer converts wavelength of the laser light ray from the light guide member to result in a laser beam, and contacts the light guide member so that heat from the wavelength conversion layer is transferred to the substrate through the light guide member.

28 Claims, 7 Drawing Sheets

(51) Int. Cl.
*H01S 5/06* (2006.01)
*H01S 5/40* (2006.01)
*H01S 5/02255* (2021.01)
*F21V 7/00* (2006.01)
*H01S 5/02208* (2021.01)

(52) U.S. Cl.
CPC .......... *H01S 5/0609* (2013.01); *H01S 5/4012* (2013.01); *F21V 7/0008* (2013.01); *H01S 5/02208* (2013.01); *H01S 5/02469* (2013.01); *H01S 5/4056* (2013.01)

(58) Field of Classification Search
CPC ............... H01S 5/02255; H01S 5/4056; H01S 5/02469; H01S 5/02208
See application file for complete search history.

(56) References Cited

U.S. PATENT DOCUMENTS

| | | | |
|---|---|---|---|
| 2014/0003074 A1* | 1/2014 | Kishimoto | C09K 11/7734 362/510 |
| 2014/0084325 A1* | 3/2014 | Yamanaka | G02F 2/02 257/98 |
| 2014/0286037 A1* | 9/2014 | Matsuba | F21K 9/64 362/553 |
| 2017/0256685 A1* | 9/2017 | Schug | F21V 9/40 |
| 2019/0257488 A1* | 8/2019 | Hechtfischer | F21S 41/285 |

* cited by examiner

LASER DEVICE AND LIGHT GUIDE MEMBER USED WITH THE SAME

CROSS-REFERENCE TO RELATED APPLICATION

This application is a bypass continuation-in-part application of PCT International Application No. PCT/CN2017/104688 filed on Sep. 30, 2017. The entire content of the international application is incorporated herein by reference.

FIELD

The disclosure relates to semiconductor devices, and more particularly to a laser device and a light guide member used with the laser device.

BACKGROUND

Laser devices have multiple advantages, such as monochromaticity, compact size, long service life, high power density, superior response time, etc., and are therefore widely used in various applications, such as distance measurement, radar, communication, weapon simulation, automatic control, detection devices, medical cosmetology, etc. In recent years, laser devices are also widely used in automotive lighting applications to replace conventional xenon or LED headlights. Compared to LED headlights, laser headlights offer higher density of light, smaller viewing angle, and longer lighting distance, which can reach 600 m and which is twice as that of the LED headlights.

Figure 1:
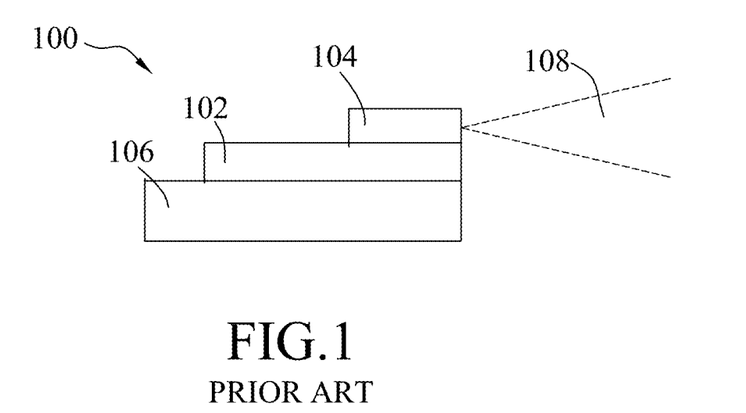
FIG. 1 is a schematic view of a conventional edge-emitting laser diode device.

FIG. 1 shows a conventional edge-emitting laser diode device 100, which includes a circuit board 106 (e.g., a printed circuit board), a sub-mount 102 that is disposed on the circuit board 106, and a laser diode 104 that is disposed on the sub-mount 102 and that is electrically connected to the circuit board 106. When a biasing is applied to the laser diode 104, a laser beam is generated by the laser diode 104. The conventional edge-emitting laser diode device 100 is usually packaged as a transistor outline package, which often suffers from inferior heat dissipation. Since heat transfer is a crucial factor for maintaining the conventional edge-emitting laser diode device 100, it is desirable to provide a laser device that has superior heat dissipation capability.

SUMMARY

Therefore, a first aspect of the present disclosure provides a laser device including a substrate, a laser element, a light guide member, and a wavelength conversion layer.

The laser element is disposed on the substrate and is adapted for emitting a laser light ray. The light guide member is disposed on the substrate, is light-transmissible and thermally conductive, and has at least one reflection surface for reflecting the laser light ray from the laser element so as to change travelling direction of the laser light ray. The wavelength conversion layer is adapted to convert wavelength of the laser light ray from the light guide member to result in a laser beam. The wavelength conversion layer contacts the light guide member so that heat from the wavelength conversion layer is transferred to the substrate through the light guide member.

A second aspect of the present disclosure provides a light guide member adapted to be used with a laser element.

The light guide member is light-transmissible and thermally conductive, and includes at least one reflection surface that is adapted to reflect a laser light ray emitted from the laser element so as to change travelling direction of the laser light ray.

A third aspect of the present disclosure provides a lighting module that includes the laser device of the first aspect.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
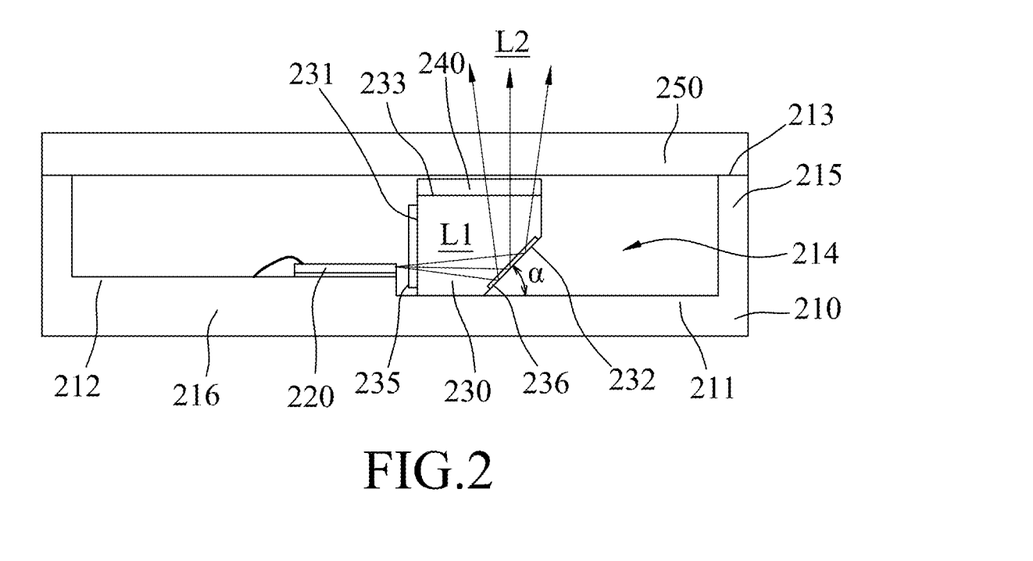
FIGS. 2 to 8 are schematic views that respectively illustrate first to seventh embodiments of a laser device according to the present disclosure.

Referring to FIG. 2, a first embodiment of a laser device according to the present disclosure includes a substrate 210, a laser element 220, a light guide member 230, a wavelength conversion layer 240, and a cover layer 250.

The substrate 210 may be bowl-shaped, and has a bottom portion 216 and a side portion 215 that is connected to the bottom portion 216 and that cooperates with the bottom portion 216 to define a receiving space 214. In this embodiment, the bottom portion 216 has a lower sub-portion 211 and a higher sub-portion 212. The substrate 210 may be made of ceramic, $Al_2O_3$, AlN, etc., and may be provided with an electric circuit. The laser element 220 is disposed on the higher sub-portion 212 of the bottom portion 216 of the substrate 210, and is adapted for emitting a laser light ray. The light guide member 230 is disposed on the lower sub-portion 211 of the bottom portion 216 of the substrate 210. The wavelength conversion layer 240 is adapted to convert the wavelength of the laser light ray from the light guide member 230 to result in a laser beam. The wavelength conversion layer 240 contacts the light guide member 230 so that heat from the wavelength conversion layer 240 is transferred to the substrate 210 through the light guide member 230.

The light guide member 230 is light-transmissible, is thermally conductive, and has at least one reflection surface 232 for reflecting the laser light ray from the laser element 220 so as to change the travelling direction of the laser light ray. In this embodiment, the light guide member 230 changes the horizontal incident laser light ray (L1) to a vertical exit laser light ray (L2). Specifically, the light guide member 230 further has an incident surface 231 through which the laser light ray emitted from the laser element 220 enters the light guide member 230, and a light-exit surface 233 through which the laser light ray exits the light guide member 230. The incident surface 231 directly faces the laser element 220, and the light guide member 230 further includes an anti-reflection layer 235 that is coated on the incident surface 231, that has a refractive index not greater than 1.5 for reducing reflection of the incident laser light ray (L1) at the incident surface 231, and that may be made of silicon dioxide, magnesium fluoride, etc. The reflection surface 232 may be a flat or curved surface, may be inclined relative to the substrate 210, and may be coated with a reflection layer 236 with a reflectivity index greater than 90%. The reflection layer 236 may be made of Ag, Al, Au or other materials with high reflectivity. The light guide member 230 may have a thermal conductivity that is not less than 5 W/(m*K). The light guide member 230 may have a light transmittance not less than 80% when the light guide member 230 has a thickness of 1 mm. The light guide member 230 may be made of a material selected from the group consisting of silicon dioxide, sapphire, ceramic, and combinations thereof. In this embodiment, a medium between the laser element 220 and the incident surface 231 has a refractive index (n1), the light guide member 230 has a refractive index (n2), and the refractive indexes (n1, n2) satisfy $((n2-n1)^2)/((n2+n1)^2)<0.05$, and the incident surface 231 of the light guide member 230 has a reflectivity index smaller than 5%. When the laser device is used in narrow viewing angle applications, such as vehicle headlight, canopy lamp, laser TV, projector, etc., an included angle ($\alpha$) between the reflection surface 232 and the substrate 210 may range from 30° to 60°. In this embodiment, an included angle between the laser beam exiting the laser device and a normal line of a top surface of the laser device is smaller than 30°. In this embodiment, the wavelength conversion layer 240 is disposed on and directly contacts the light-exit surface 233 of the light guide member 230. The wavelength conversion layer 240 may be selected from the group consisting of a phosphor-in-glass layer, a phosphor-in-ceramic layer, a single crystal fluorescence layer, and combinations thereof. The wavelength conversion layer 240 converts the laser light ray with shorter wavelength to the laser beam with longer wavelength (i.e., the laser beam having a wavelength larger than that of the laser light ray). For example, a blue, purple, or near ultraviolet laser light ray may be converted by the wavelength conversion layer 240 to a green, yellow, orange, or red laser beam. The wavelength conversion layer 240 may be connected to the light guide member 230 by surface activated bonding, atomic diffusion bonding, etc. Alternatively, the laser device further includes an adhesive layer that is connected between the light-exit surface 233 of the light guide member 230 and the wavelength conversion layer 240, and that has a thermal conductivity not less than 1 W/(m*K). In this embodiment, the laser beam exiting the laser device has a viewing angle smaller than 90°, and has a maximum light intensity in a direction parallel to a normal line of the top surface of the laser device.

The cover layer 250 is light-transmissible and is connected to a top surface 213 of the substrate 210 to cooperate with the substrate 210 so as to enclose the laser element 220, the light guide member 230 and the wavelength conversion layer 240 in the receiving space 214. The cover layer 250 may be made of glass, quartz, sapphire, ceramic, etc. Alternatively, the cover layer 250 may be omitted, and the laser element 220, the light guide member 230 and the wavelength conversion layer 240 may be encapsulated by silica gel.

Figure 3:
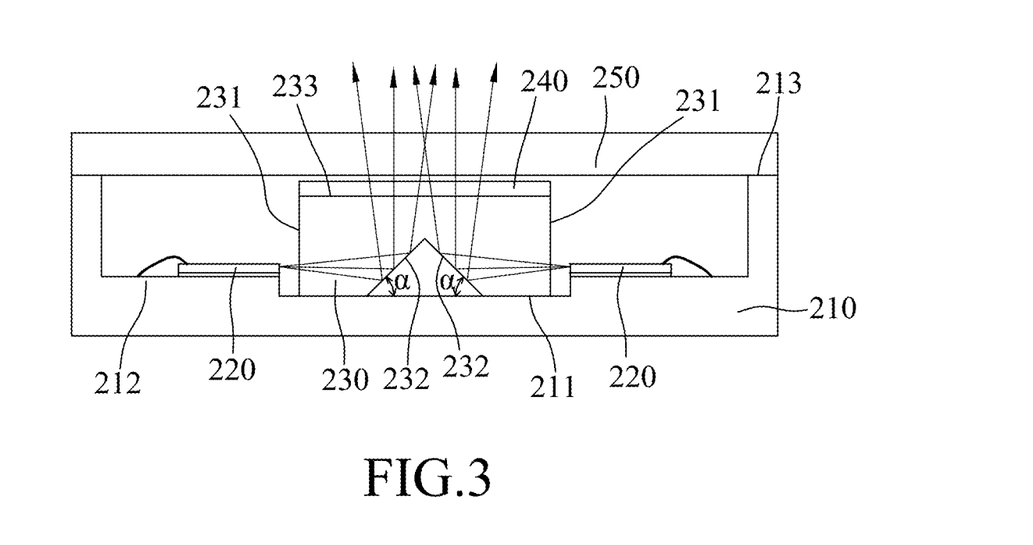

Referring to FIG. 3, a second embodiment of the laser device according to the present disclosure has a structure modified from that of the first embodiment, and the differences are described below. In the second embodiment, the light guide member 230 is located at the center of the substrate 210, and includes two of the reflection surfaces 232 and two of the incident surfaces 231, and the laser device includes two of the laser elements 220 each facing a respective one of the reflection surfaces 232. The included angle ($\alpha$) between each of the reflection surfaces 232 and the substrate 210 may range from 30° to 60°. The laser elements 220 are adapted for emitting the laser light rays respectively toward the reflection surfaces 232 such that the laser light rays are respectively reflected by the reflection surfaces 232 and then pass through the wavelength conversion layer 240 to generate the laser beams, respectively. The included angle between each of the laser beams exiting the laser device and the normal line of the top surface of the laser device is smaller than 30°, and each of the laser beams has an over 50% overlap with an adjacent one of the laser beams.

In the second embodiment, the included angle ($\alpha$) between each of the reflection surfaces 232 and the substrate 210 may be adjusted to change the percentage of each of the laser beams overlapping with the adjacent one of the laser beams, according to practical requirements. In certain embodiments, in the range from 30° to 60°, the smaller the included angle ($\alpha$) between the reflection surfaces 232 and the substrate 210, the larger the overlap percentage. In addition, a distance between a point where the laser light ray hits the corresponding reflection surface 232 and the wavelength conversion layer 240 may be adjusted according to practical requirements. In certain embodiments, the larger the distance, the larger the overlap percentage.

Figure 4:
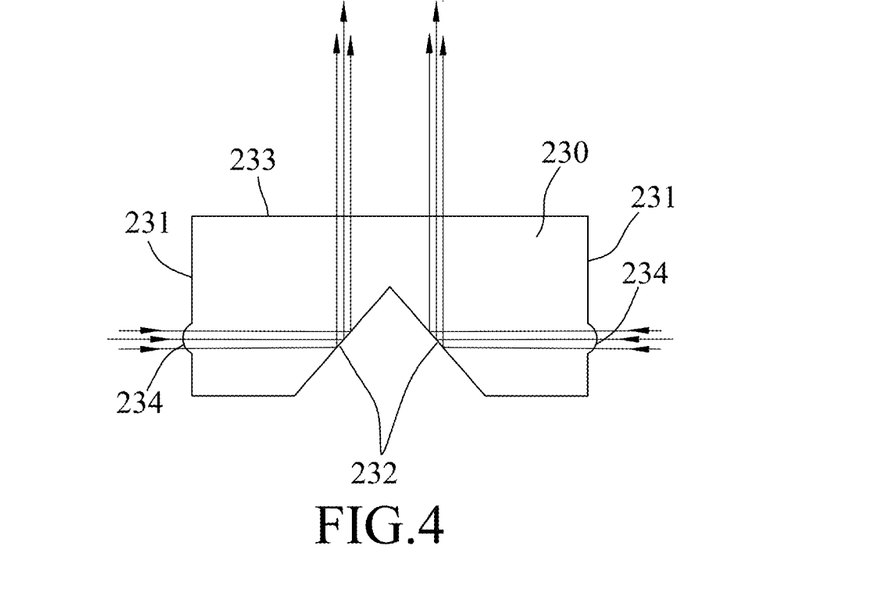

Referring to FIG. 4, a third embodiment of the laser device according to the present disclosure has a structure modified from that of the second embodiment, and the differences are described below. In the third embodiment, the light guide member 230 further has two microlenses 234 that are respectively formed on the incident surfaces 231 such that the laser light rays are collimated after respectively passing through the microlenses 234 to achieve smaller viewing angle.

Figure 5:
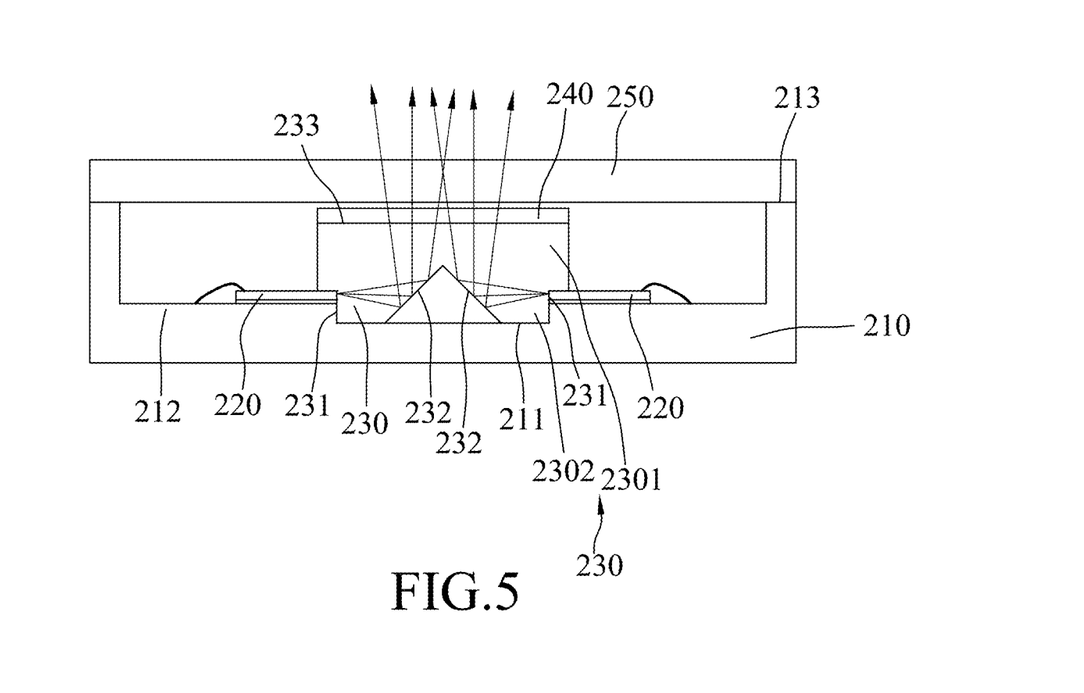

Referring to FIG. 5, a fourth embodiment of the laser device according to the present disclosure has a structure modified from that of the second embodiment, and the differences are described below. In the fourth embodiment, the light guide member 230 has an upper portion 2301 and a lower portion 2302. The lower portion 2302 has a horizontal width smaller than that of the upper portion 2301, and is adapted to be in direct contact with the laser elements 220, so that a distance between each of the laser elements 220 and the corresponding reflection surface 232 is reduced, thereby reducing attenuation of the laser light rays caused by travelling in a medium. In the fourth embodiment, the upper portion 2301 of the light guide member 230 with a larger horizontal width ensures effective heat dissipation from the wavelength conversion layer 240 to the substrate 210.

Figure 6:
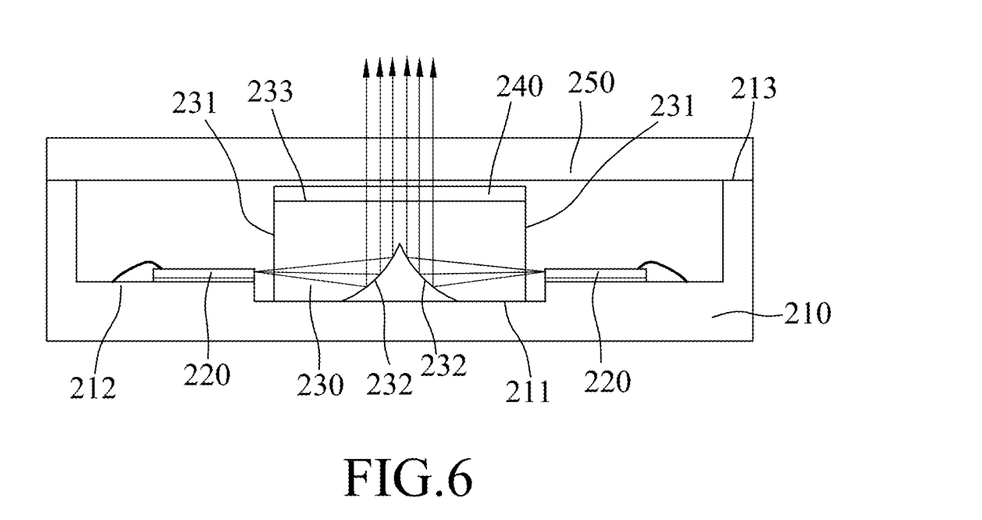

Referring to FIG. 6, a fifth embodiment of the laser device according to the present disclosure has a structure modified from that of the second embodiment, and the differences are described below. In the fifth embodiment, each of the reflection surfaces 232 is a curved surface (e.g., a concave surface) such that the laser light rays are collimated after being respectively reflected by the reflection surfaces 232. In certain applications, such as small viewing angle applications, for each of the reflection surfaces 232, an included angle between a tangent line to the reflection surface 232 and the substrate 210 may range from 30° to 60°, and the included angle between each of the laser beams existing the laser device and the normal line of the top surface of the laser device is smaller than 30°.

Figure 7:
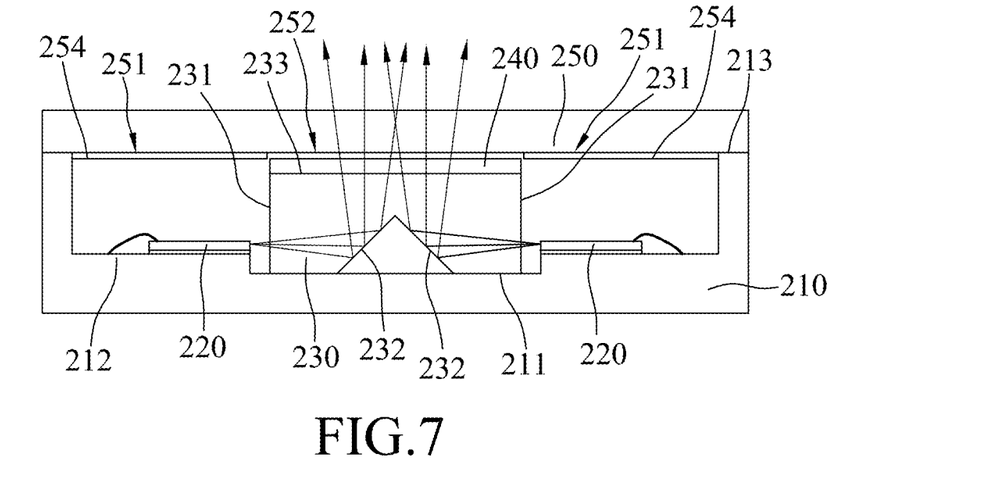

Referring to FIG. 7, a sixth embodiment of the laser device according to the present disclosure has a structure modified from that of the second embodiment, and the differences are described below. In the sixth embodiment, the cover layer 250 has a bottom surface that faces the receiving space 214 and that is defined into a light blocking region 251 and a light penetrating region 252. The laser device further includes a reflection layer 254 that is formed on the light blocking layer 251 so that the laser beams directed by the reflection surfaces 232 onto the light blocking region 251 are reflected, and the laser beams directed by the reflection surfaces 232 onto the light penetrating region 252 are not reflected and are allowed to pass through the cover layer 250, thereby reducing the viewing angle of the laser device.

Figure 8:
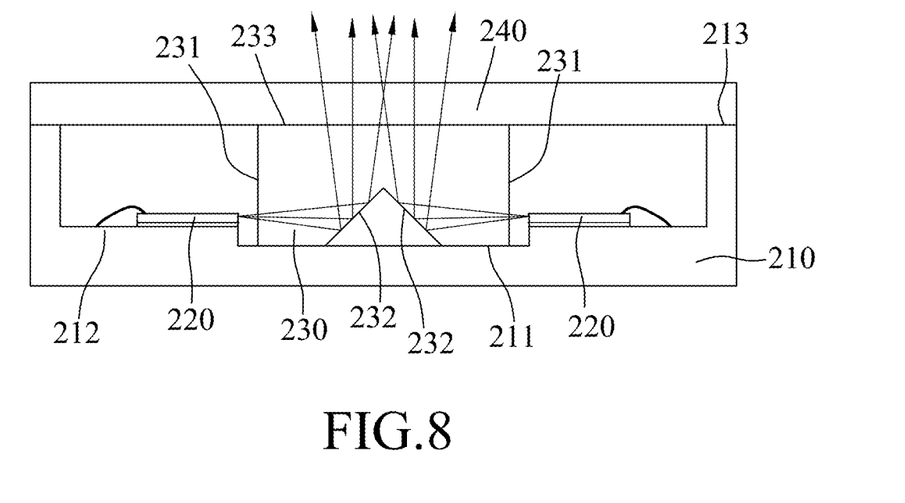

Referring to FIG. 8, a seventh embodiment of the laser device according to the present disclosure has a structure modified from that of the second embodiment, and the differences are described below. In the seventh embodiment, the light-exit surface 233 of the light guide member 230 is flush with the top surface 213 of the substrate 210, the cover layer 250 is omitted, and the wavelength conversion layer 240 is directly connected to (i.e., in direct contact with) the top surface 213 of the substrate 210 and the light-exit surface 233 of the light guide member 230 to encapsulate the laser elements 220 and the light guide member 230, thereby simplifying manufacturing process and reducing interfaces within the laser device so as to improve light extraction efficiency of the laser device.

Figure 9:
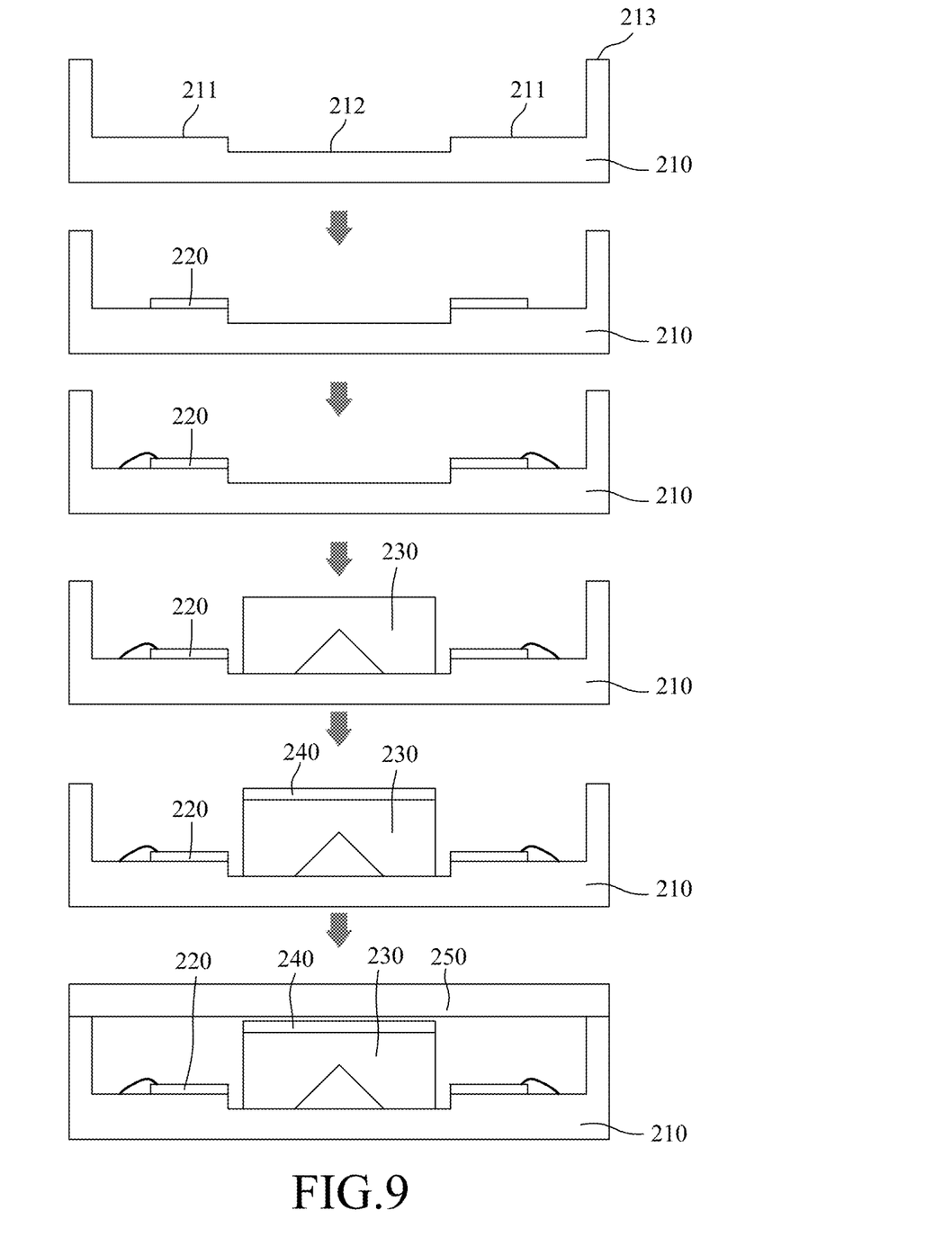
FIG. 9 shows a process flow for manufacturing the second embodiment of the laser device shown in FIG. 3.

FIG. 9 illustrates a process flow for manufacturing the second embodiment of the laser device of this disclosure. The laser elements 220 are first mounted to the substrate 210 at desired locations, and then the laser elements 220 are electrically connected to the electric circuit on the substrate 210 via, for example, wire bonding, followed by mounting the light guide member 230 to the substrate 210 at a desired location. Then, the wavelength conversion layer 240 is mounted to the light guide member 230. Finally, the cover layer 250 is connected to the substrate 210 using silica gel, Au—Sn eutectic solder, etc., thereby obtaining the laser device.

Figure 10:
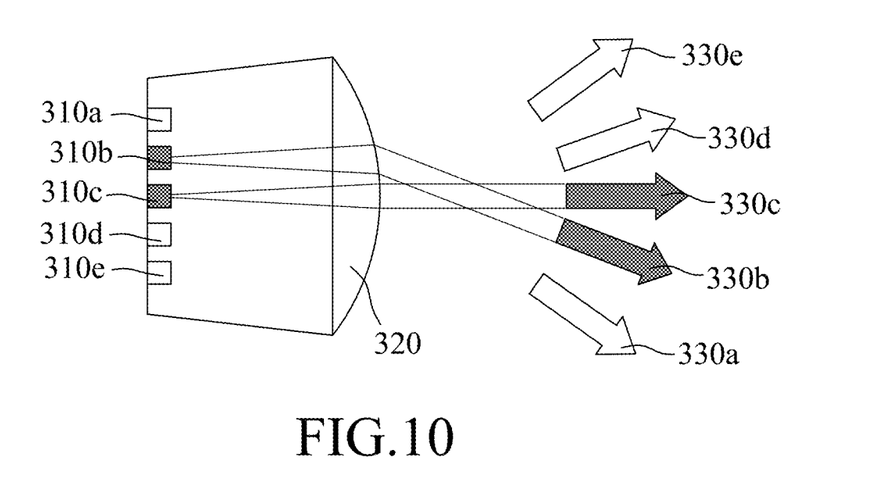
FIG. 10 is a schematic view of a light module that includes a plurality of the laser device according to the present disclosure.

Referring to FIG. 10, a lighting module may include a plurality of the laser devices 310a-310e that are independently controllable. The lighting module may further include a lens 320 and a reflection lens (not shown) for enhancing control of lights. The lighting module may be used as a vehicle headlight. When facing an oncoming vehicle or a pedestrian, the lighting module may be operated such that only the laser devices 310b, 310c are lit up, thereby achieving the purpose of illumination without blinding the oncoming vehicle or the pedestrian. Besides vehicle headlights, the laser device according to the present disclosure may also be used in various applications, such as canopy lamp, fish-luring lamp, marine lighting, projector, laser TV, optical communication, etc.

The laser device according to the present disclosure has a simplified manufacturing process, and has an effective heat dissipation route for the heat generated by the wavelength conversion layer 240 to be transferred to the substrate 210 through the light guide member 230. In addition, the reflection surface(s) 232 of the light guide member 230 enables the laser device to have a smaller viewing angle, which is particularly desirable in specialized applications.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiment but is intended to cover various arrangements included within the spirit and scope of the broadest interpretation so as to encompass all such modifications and equivalent arrangements.

What is claimed is:

1. A laser device comprising:
   a substrate;
   a plurality of laser elements that are disposed on said substrate and that are adapted for emitting laser light rays;
   a light guide member that is disposed on said substrate, that is light-transmissible and thermally conductive, and that has a plurality of incident surfaces through which the laser light rays from said laser elements enter said light guide member, a plurality of reflection surfaces for reflecting the laser light rays from said laser elements so as to change travelling direction of the laser light rays, and a bottom surface directly connected to said substrate; and
   a wavelength conversion layer that is adapted to convert wavelength of the laser light rays from said light guide members to result in a plurality of laser beams, said wavelength conversion layer contacting said light guide member so that heat from said wavelength conversion layer is transferred to said substrate through said light guide member.

2. The laser device as claimed in claim 1, wherein said light guide member has a thermal conductivity that is not less than 5 W/(m*K), and wherein said light guide member has a light transmittance that is not less than 80% when said light guide member has a thickness of 1 mm.

3. The laser device as claimed in claim 1, wherein said light guide member is made of a material selected from the group consisting of silicon dioxide, sapphire, ceramic, and combinations thereof.

4. The laser device as claimed in claim 1, wherein:
   said light guide member further has a light-exit surface through which the laser light rays exit said light guide member; and
   said wavelength conversion layer is disposed on said light-exit surface.

5. The laser device as claimed in claim 4, wherein said light guide member further includes an anti-reflection layer that is coated on one of said incident surfaces and that has a refractive index not greater than 1.5.

6. The laser device as claimed in claim 4, wherein:
   a medium between said laser element and said incident surface has a refractive index (n1);
   said light guide member has a refractive index (n2); and the refractive indexes (n1, n2) satisfy $((n2-n1)^2)/((n2+n1)^2)<0.05$.

7. The laser device as claimed in claim 4, wherein said light guide member further has at least one microlens that is formed on one of said incident surfaces such that one of the laser light rays is collimated after passing through said microlens.

8. The laser device as claimed in claim 4, wherein each of said incident surfaces of said light guide member has a reflectivity index smaller than 5%.

9. The laser device as claimed in claim 1, wherein at least one of said reflection surfaces of said light guide member is a flat or curved surface, is inclined relative to said substrate, and is coated with a reflection layer with a reflectivity index greater than 90%.

10. The laser device as claimed in claim 1, wherein an included angle between each of said reflection surfaces and said substrate ranges from 30° to 60°.

11. The laser device as claimed in claim 1, wherein an included angle between one of the laser beams exiting said laser device and a normal line of a top surface of said laser device is smaller than 30°.

12. The laser device as claimed in claim 1, wherein each of the laser beams has an over 50% overlap with an adjacent one of the laser beams.

13. The laser device as claimed in claim 1, wherein a light-emitting surface of said laser element is in direct contact with said light guide member.

14. The laser device as claimed in claim 1, wherein each of the laser beams resulted from a respective one of the laser light rays has a wavelength larger than the respective one of the laser light rays.

15. The laser device as claimed in claim 1, wherein said wavelength conversion layer is selected from the group consisting of a phosphor-in-glass layer, a phosphor-in-ceramic layer, a single crystal fluorescence layer, and combinations thereof.

16. The laser device as claimed in claim 1, wherein each of the laser beams exiting said laser device has a viewing angle smaller than 90°, and has a maximum light intensity in a direction parallel to a normal line of a top surface of said laser device.

17. The laser device as claimed in claim 1, wherein said wavelength conversion layer is connected to said light guide member by one of surface activated bonding and atomic diffusion bonding.

18. The laser device as claimed in claim 1, further comprising an adhesive layer that is connected between said light guide member and said wavelength conversion layer, and that has a thermal conductivity of not less than 1 W/(m*K).

19. The laser device as claimed in claim 1, wherein:
said substrate has a bottom portion that holds said laser elements and said light guide member, and a side portion that is connected to said bottom portion and that cooperates with said bottom portion to define a receiving space for receiving said laser elements and said light guide member;
said wavelength conversion layer is connected to a top end of said side portion of said substrate to cooperate with said substrate to enclose said laser elements and said light guide member in said receiving space; and
said wavelength conversion layer is in direct contact with said light guide member.

20. The laser device as claimed in claim 1, wherein:
said substrate defines a receiving space that receives said laser elements and said light guide member; and
said laser device further comprises a cover layer that is light-transmissible and that is connected to said substrate to cooperate with said substrate to enclose said laser elements, said light guide member and said wavelength conversion layer in said receiving space.

21. The laser device as claimed in claim 20, wherein said cover layer has a bottom surface facing said receiving space and being defined into a light blocking region and a light penetrating region, said laser device further comprising a reflection layer that is formed on said light blocking region so that the laser beams directed onto said light blocking region are reflected and the laser beams directed onto said light penetrating region passes through said cover layer.

22. A light guide member adapted to be used with a plurality of laser elements, said light guide member being light-transmissible and thermally conductive, and comprising a plurality of incident surfaces through which a plurality of laser light rays from the laser element enter said light guide member, and a plurality of reflection surfaces that are adapted to reflect the laser light rays emitted from said laser elements so as to change travelling direction of the laser light rays.

23. The light guide member as claimed in claim 22, wherein said light guide member has a thermal conductivity that is not less than 5 W/(m*K), and said light guide member has a light transmittance that is not less than 80% when said light guide member has a thickness of 1 mm.

24. The light guide member as claimed in claim 22, further comprising an upper portion and a lower portion, said lower portion having a horizontal width smaller than that of said upper portion and being adapted to be in direct contact with said laser elements.

25. The light guide member as claimed in claim 22, further comprising:
a light-exit surface through which the laser light rays exit said light guide member; and
a microlens that is formed on one of said incident surfaces such that one of the laser light rays is collimated after passing through said microlens.

26. The light guide member as claimed in claim 22, wherein at least one of said reflection surfaces of said light guide member is a curved surface such that the laser light ray is collimated after being reflected by said at least one reflection surface.

27. The light guide member as claimed in claim 22, wherein:
said light guide member being adapted to be disposed on a substrate; and
an included angle between each of said reflection surfaces and the substrate ranges from 30° to 60°.

28. A lighting module comprising a laser device, said laser device comprising:
a substrate;
a plurality of laser elements that are disposed on said substrate and that are adapted for emitting laser light rays;
a light guide member that is disposed on said substrate, that is light-transmissible and thermally conductive, and that has a plurality of incident surfaces through which the laser light rays from said laser elements enter said light guide member, a plurality of reflection surfaces for reflecting the laser light rays from said laser elements so as to change travelling direction of the laser light rays, and a bottom surface directly connected to said substrate; and a wavelength conversion layer that is adapted to convert wavelength of the laser light rays from said light guide members to result in a plurality of laser beams, said wavelength conversion layer contacting said light guide member so that heat from said wavelength conversion layer is transferred to said substrate through said light guide member.

* * * * *